(12) United States Patent
Wu

(10) Patent No.: US 9,473,126 B2
(45) Date of Patent: Oct. 18, 2016

(54) LATCH AND FREQUENCY DIVIDER

(71) Applicant: Spreadtrum Communications (Shanghai) Co., Ltd., Shanghai (CN)

(72) Inventor: Yiqiang Wu, Shanghai (CN)

(73) Assignee: SPREADTRUM COMMUNICATIONS (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 14/673,710

(22) Filed: Mar. 30, 2015

(65) Prior Publication Data

US 2016/0126938 A1    May 5, 2016

(30) Foreign Application Priority Data

Oct. 31, 2014  (CN) .......................... 2014 1 0608708

(51) Int. Cl.
*H03K 3/356* (2006.01)
*H03K 5/04* (2006.01)
*H03K 23/40* (2006.01)

(52) U.S. Cl.
CPC .......... *H03K 5/04* (2013.01); *H03K 3/356139* (2013.01); *H03K 3/356191* (2013.01); *H03K 23/40* (2013.01)

(58) Field of Classification Search
CPC ................. H03K 3/356026; H03K 3/356078; H03K 3/35625; H03K 3/037; H03K 3/287; H03K 3/288
USPC .................................. 327/213, 214, 215, 218
See application file for complete search history.

(56) References Cited

U.S. PATENT DOCUMENTS

2007/0241796 A1* 10/2007 Sie .......................... H03K 3/012
                                                              327/115

* cited by examiner

*Primary Examiner* — John Poos
(74) *Attorney, Agent, or Firm* — Vierra Magen Marcus LLP

(57) ABSTRACT

A latch and a frequency divider are provided. The latch includes: a first logic unit coupled between a power supply and a ground wire, wherein the first logic unit comprises a first control terminal, a first input terminal and a first output terminal; a second logic unit having a structure symmetrical to that of the first logic unit, wherein the second logic unit comprises a second control terminal, a second input terminal and a second output terminal; and a feedforward control unit adapted for cutting off a current path in the first logic unit or the second logic unit based on signals inputted into the first input terminal and the second input terminal. Power consumption of the latch can be reduced in both static working condition and dynamic working condition.

23 Claims, 12 Drawing Sheets

LATCH AND FREQUENCY DIVIDER

CROSS-REFERENCE TO RELATED APPLICATIONS

The present application claims priority to Chinese patent application No. 201410608708.5, filed on Oct. 31, 2014, and entitled "LATCH AND FREQUENCY DIVIDER", the entire disclosure of which is incorporated herein by reference.

TECHNICAL FIELD

The present disclosure generally relates to semiconductor technology, and more particularly, to a latch and a frequency divider.

BACKGROUND

With development of communication technology, high speed frequency dividers based on razavi-structured latches have been widely used, because of better performance such as high speed and wide bandwidth thereof.

In the conventional technology, a high speed divide-by-2 frequency divider is constituted by two latches, where each latch servers as a follow-up unit of the other latch.

However, in the above high speed divide-by-2 frequency divider, when a signal applied on a control terminal of a latch is in a low level, a current path will be formed, in both static working condition and dynamic working condition, between the power supply and the ground. Accordingly, the latch of the conventional high speed frequency divider has a problem of high power consumption.

SUMMARY

The present disclosure aims to reduce power consumption of the conventional high speed divide-by-2 frequency divider in static working condition and in dynamic working condition.

In order to solve the above problems, a latch is provided in embodiments of the present disclosure. In one embodiment, the latch includes:

a first logic unit coupled between a power supply and a ground wire, wherein the first logic unit includes a first control terminal, a first input terminal and a first output terminal;

a second logic unit having a structure symmetrical to that of the first logic unit, wherein the second logic unit includes a second control terminal, a second input terminal and a second output terminal; and a feedforward control unit adapted for cutting off a current path in the first logic unit or the second logic unit based on signals inputted into the first input terminal and the second input terminal.

In some embodiments, the feedforward control unit includes at least one of a first control sub-unit or a second control sub-unit, wherein the first control sub-unit is adapted for cutting off a first current path in the first logic unit, when a signal inputted into the first input terminal is in low level and a signal inputted into the second input terminal is in high level; and wherein the second control sub-unit is adapted for cutting off a second current path in the second logic unit, when a signal inputted into the first input terminal is in high level and a signal inputted into the second input terminal is in low level.

In some embodiments, the first logic unit includes a first transistor, a third transistor and a fifth transistor, and the second logic unit includes a second transistor, a fourth transistor and a sixth transistor, wherein a source of the first transistor is coupled with the ground wire, a gate of the first transistor is coupled with the first control terminal, a drain of the first transistor is coupled with a drain of the third transistor, a drain of the fifth transistor, a gate of the fourth transistor and the first output terminal;

wherein a source of the second transistor is coupled with the ground wire, a gate of the second transistor is coupled with the second control terminal, a drain of the second transistor is coupled with a drain of the fourth transistor, a drain of the sixth transistor, a gate of the third transistor and the second output terminal; and wherein sources of the third transistor, the fourth transistor, the fifth transistor and the sixth transistor are coupled with the power supply.

In some embodiments, the first control sub-unit includes a seventh transistor which is an NMOS transistor, wherein a source of the seventh transistor is coupled with the drain of the first transistor, a gate of the seventh transistor is coupled with the first input terminal, and a drain of the seventh transistor is coupled with the drain of the third transistor, the drain of the fifth transistor, the gate of the fourth transistor and the first output terminal.

In some embodiments, the first control sub-unit further includes an eighth transistor which is an NMOS transistor, wherein a source of the eighth transistor is coupled with the drain of the second transistor, a gate of the eighth transistor is coupled with the second input terminal, a drain of the eighth transistor is coupled with the drain of the fourth transistor, the drain of the sixth transistor, the gate of the third transistor and the second output terminal.

In some embodiments, the source of the seventh transistor and the source of the eighth transistor are coupled with each other.

In some embodiments, the first control sub-unit includes a seventh transistor which is an NMOS transistor, wherein a source of the seventh transistor is coupled with the ground wire, a gate of the seventh transistor is coupled with the first input terminal, and a drain of the seventh transistor is coupled with the source of the first transistor.

In some embodiments, the first control sub-unit further includes an eighth transistor which is an NMOS transistor, wherein a source of the eighth transistor is coupled with the ground wire, a gate of the eighth transistor is coupled with the second input terminal, and a drain of the eighth transistor is coupled with the source of the second transistor.

In some embodiments, wherein the first control sub-unit includes a seventh transistor which is a PMOS transistor, wherein a drain of the seventh transistor is coupled with the drain of the first transistor, a gate of the seventh transistor is coupled with the second input terminal, a source of the seventh transistor is coupled with the drain of the third transistor, the drain of the fifth transistor, the gate of the fourth transistor and the first output terminal.

In some embodiments, the first control sub-unit further includes an eighth transistor which is a PMOS transistor, wherein a drain of the eighth transistor is coupled with the drain of the second transistor, a gate of the eighth transistor is coupled with the first input terminal, a source of the eighth transistor is coupled with the drain of the fourth transistor, the drain of the sixth transistor, the gate of the third transistor and the second output terminal.

In some embodiments, the drain of the seventh transistor and the drain of the eighth transistor are coupled with each other.

In some embodiments, the first control sub-unit includes a seventh transistor which is a PMOS transistor, wherein a drain of the seventh transistor is coupled with the ground wire, a gate of the seventh transistor is coupled with the second input terminal, a source of the seventh transistor is coupled with the source of the first transistor.

In some embodiments, the first control sub-unit further includes an eighth transistor which is a PMOS transistor, wherein a drain of the eighth transistor is coupled with the ground wire, a gate of the eighth transistor is coupled with the first input terminal, a source of the eighth transistor is coupled with the source of the second transistor.

In some embodiments, the second control sub-unit includes a ninth transistor which is an NMOS transistor, wherein a source of the ninth transistor is coupled with the drain of the second transistor, a gate of the ninth transistor is coupled with the second input terminal, a drain of the ninth transistor is coupled with the drain of the fourth transistor, the drain of the sixth transistor, the gate of the third transistor and the second output terminal.

In some embodiments, the second control sub-unit further includes a tenth transistor which is an NMOS transistor, wherein a source of the tenth transistor is coupled with the drain of the first transistor, a gate of the tenth transistor is coupled with the first input terminal, a drain of the tenth transistor is coupled with the drain of the third transistor, the drain of the fifth transistor, the gate of the fourth transistor and the first output terminal.

In some embodiments, the source of the ninth transistor and the source of the tenth transistor are coupled with each other.

In some embodiments, the second control sub-unit includes a ninth transistor which is an NMOS transistor, wherein a source of the ninth transistor is coupled with the ground wire, a gate of the ninth transistor is coupled with the second input terminal, a drain of the ninth transistor is coupled with the source of the second transistor.

In some embodiments, the second control sub-unit further includes a tenth transistor which is an NMOS transistor, wherein a source of the tenth transistor is coupled with the ground wire, a gate of the tenth transistor is coupled with the first input terminal, a drain of the tenth transistor is coupled with the source of the first transistor.

In some embodiments, the second control sub-unit includes a ninth transistor which is a PMOS transistor, wherein a drain of the ninth transistor is coupled with the drain of the second transistor, a gate of the ninth transistor is coupled with the first input terminal, a source of the ninth transistor is coupled with the drain of the fourth transistor, the drain of the sixth transistor, the gate of the third transistor and the second output terminal.

In some embodiments, the second control sub-unit further includes a tenth transistor which is a PMOS transistor, wherein a drain of the tenth transistor is coupled with the drain of the first transistor, a gate of the tenth transistor is coupled with the second input terminal, a source of the tenth transistor is coupled with the drain of the third transistor, the drain of the fifth transistor, the gate of the fourth transistor and the first output terminal.

In some embodiments, the drain of the ninth transistor and the drain of the tenth transistor are coupled with each other.

In some embodiments, the second control sub-unit includes a ninth transistor which is a PMOS transistor, wherein a drain of the ninth transistor is coupled with the ground wire, a gate of the ninth transistor is coupled with the first input terminal, a source of the ninth transistor is coupled with the source of the second transistor.

In some embodiments, the second control sub-unit further includes a tenth transistor which is a PMOS transistor, wherein a drain of the tenth transistor is coupled with the ground wire, a gate of the tenth transistor is coupled with the second input terminal, a source of the tenth transistor is coupled with the source of the first transistor.

Correspondingly, a frequency divider is also provided in embodiments of the present disclosure. The frequency divider includes at least two of the latches described above, wherein the at least two of the latches include a first latch and a second latch, and the first input terminal and the second input terminal of the first latch are respectively coupled with the first output terminal and the second output terminal of the second latch.

Compared with the conventional technology, embodiments of the present disclosure have following advantages.

The feedforward control unit in the latch is adapted to cut off current paths between power supply and ground wire based on differential signals between the first input terminal and the second input terminal. Therefore, static power consumption of the latch in a static working condition can be eliminated, and dynamic power consumption in a dynamic working condition can be reduced too.

DETAILED DESCRIPTION

Figure 1:
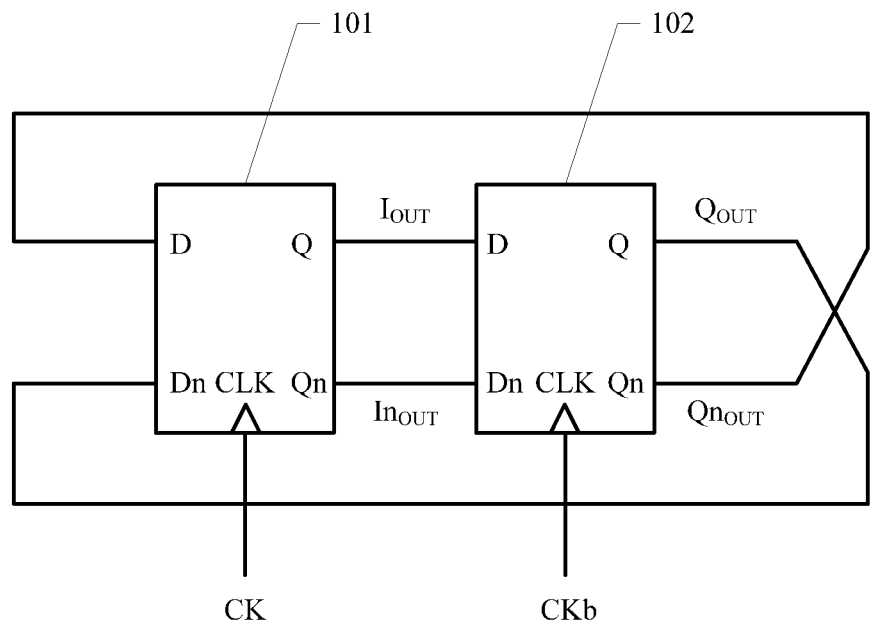
FIG. 1 schematically illustrates a schematic structure of a conventional frequency divider.

As shown in FIG. 1, a conventional high speed divide-by-2 frequency divider includes a first latch 101 and a second latch 102, where each latch servers as a follow-up unit of the other latch.

A frequency of output signal of the high speed divide-by-2 frequency divider is one half of a frequency of input signal, and the high speed divide-by-2 frequency divider can output orthogonal frequency divided signals having a duty ratio of 25% or 75%.

Figure 2:
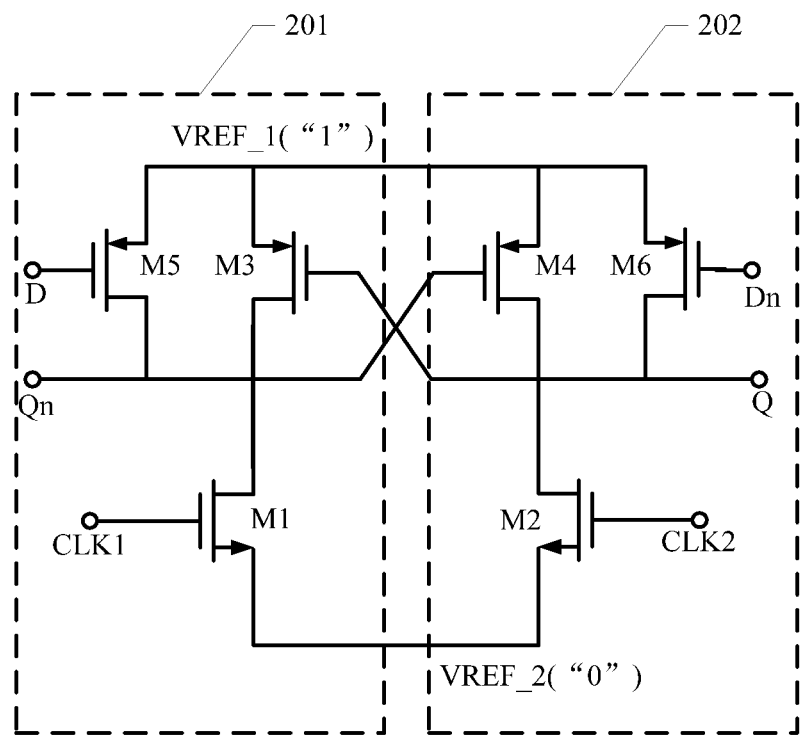
FIG. 2 schematically illustrates a structure of a latch in the frequency divider shown in FIG. 1.

FIG. 2 illustrates a circuit diagram of a latch 200 in the conventional high speed divide-by-2 frequency divider. The high speed divide-by-2 frequency divider can output frequency divided signals having a duty ratio of 75%. Referring to FIG. 2, the latch 200 includes a first logic unit 201 and a second logic unit 202, where the first logic unit 201 and the second logic unit 202 are both connected between a power supply VREF_1 and a ground wire VREF_2.

The first logic unit 201 has a first control terminal CLK1, a first input terminal D and a first output terminal Qn, and the second logic unit 202 has a second control terminal CLK2, a second input terminal Dn and a second output terminal Q.

The first logic unit 201 includes a first transistor M1, a third transistor M3, and a fifth transistor M5. The second logic unit 202 includes a second transistor M2, a fourth transistor M4, and a sixth transistor M6. The first transistor M1 and the second transistor M2 are NMOS (N-channel Metal Oxide Semiconductor) transistors. The third transistor M3, the fourth transistor M4, the fifth transistor M5 and the sixth transistor M6 are PMOS (P-channel Metal Oxide Semiconductor) transistors.

Source of the first transistor M1 and source of the second transistor M2 are coupled with a ground wire VREF_2. Gate of the first transistor M1 and gate of the second transistor M2 are respectively coupled with the first control terminal CLK1 and the second control terminal CLK2. Drain of the first transistor M1 is coupled with drain of the third transistor M3, drain of the fifth transistor M5, the first output terminal Qn, and gate of the fourth transistor M4. Drain of the second transistor M2 is coupled with drain of the fourth transistor M4, drain of the sixth transistor M6, the second output terminal Q and gate of the third transistor M3. Sources of the third transistor M3, the fourth transistor M4, the fifth transistor M5, and the sixth transistor M6 are coupled with a power supply VREF_1.

When the first control terminal CLK1 and the second control terminal CLK2 are both in high level ("1"), the first transistor M1 and the second transistor M2 are both on. At this moment, if the first input terminal D is in low level and the second input terminal Dn is in high level, the fifth transistor M5 is on, the sixth transistor M6 is off, the third transistor M3 is on and the fourth transistor M4 is off. Meanwhile, a direct current path from the power supply VREF_1 to the third transistor M3/the fifth transistor M5, the first transistor M1 and the VREF_2 is formed, and the latch has direct current power consumption.

When the first control terminal CLK1 and the second control terminal CLK2 are both in low level ("0"), the first transistor M1 and the second transistor M2 are both off. The second output terminal Q and the first output terminal Qn are charged through the fifth transistor M5 and the sixth transistor M6 respectively, so that both the second output terminal Q and the first output terminal Qn have an electrical level approximately equal to that of the power supply VREF_1.

Moreover, when the first control terminal CLK1 and the second control terminal CLK 2 are in dynamic working conditions, current paths will be formed between the power supply VREF_1 and the ground wire VREF_2 in the latch, and dynamic power consumption of the latch are increased.

Accordingly, the latch of the conventional high speed divide-by-2 frequency divider has static power consumption and dynamic power consumption in the static working condition and in the dynamic working condition respectively, which limit applications of the high speed frequency divider.

In order to solve the above problem in the conventional technology, a latch is provided in embodiments of the present disclosure. A feedforward control unit in the latch is adapted to cut off current paths between power supply and ground wire based on differential signals between the first input terminal and the second input terminal. Therefore, static power consumption of the latch in a static working condition can be eliminated, and dynamic power consumption in a dynamic working condition can be reduced too.

In order to clarify the objects, characteristics and advantages of the disclosure, the embodiments of the present disclosure will be described in detail in conjunction with the accompanying drawings.

Figure 3:
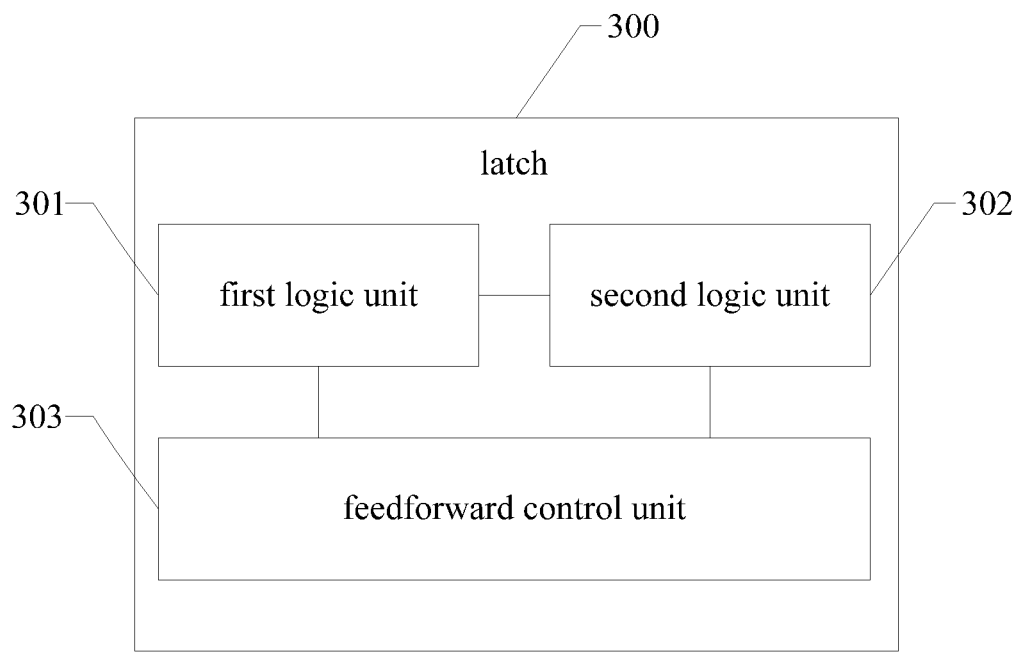
FIG. 3 schematically illustrates a block diagram of a latch according to one embodiment of the present disclosure.

Referring to FIG. 3, a block diagram of a latch according to one embodiment of the present disclosure is illustrated. The latch 300 includes: a first logic unit 301 coupled between a power supply VREF_1 and a ground wire VREF2; a second logic unit 302 which has a structure symmetrical to that of the first logic unit 301; and a feedforward control unit 303.

The first logic unit 301 has a first control terminal CLK1, a first input terminal D and a first output terminal Qn. The second logic unit 302 has a second control terminal CLK2, a second input terminal Dn and a second output terminal Q.

The feedforward control unit 303 is adapted for cutting off a current path in the first logic unit 301 or the second logic unit 302 based on signals inputted into the first input terminal D and the second input terminal Dn.

Figure 4:
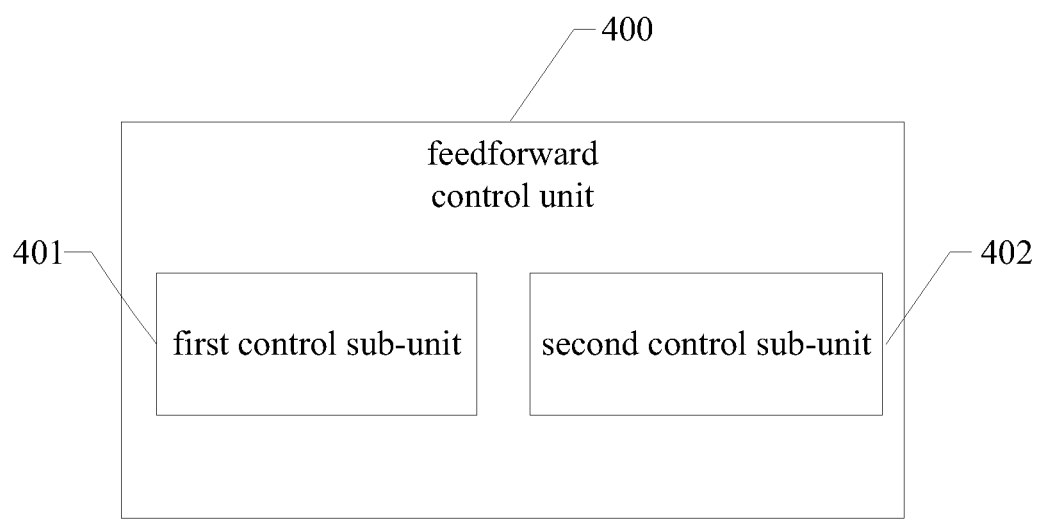
FIG. 4 schematically illustrates a block diagram of a feedforward control unit according to one embodiment of the present disclosure.

Referring to FIG. 4, a block diagram of a feedforward control unit according to one embodiment of the present disclosure is illustrated. The feedforward control unit 400 includes a first control sub-unit 401, a second control sub-unit 402, or both the first control sub-unit 401 and the second control sub-unit 402.

The first control sub-unit 401 is adapted to cut off a first current path in the first logic unit 301, when signals inputted into the first input terminal D and the second input terminal Dn are respectively in low level and high level.

The second control sub-unit 402 is adapted to cut off a second current path in the second logic unit 302, when signals inputted into the first input terminal D and the second input terminal Dn are respectively in high level and low level.

Figure 5:
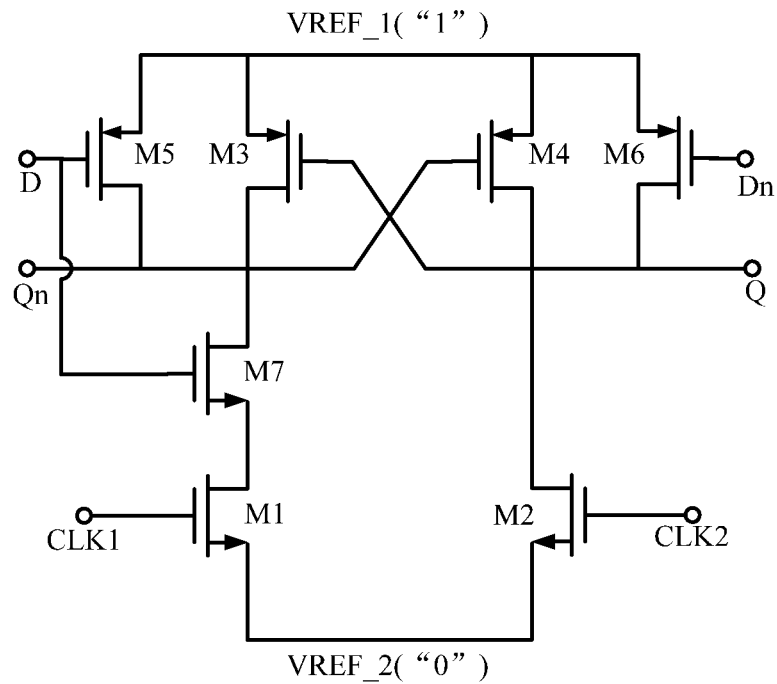
FIGS. 5-24 schematically illustrate different circuit configurations of a latch according to different embodiments of the present disclosure.

Referring to FIG. 5, a circuit diagram of a latch is illustrated according to one embodiment of the present disclosure. The latch includes a first logic unit, a second logic unit and a first control sub-unit, wherein the first control sub-unit includes a seventh transistor M7.

In comparison with the latch shown in FIG. 2, the latch shown in FIG. 5 includes the seventh transistor M7 in addition. Furthermore, the seventh transistor M7 is a NMOS transistor.

Source of the seventh transistor M7 is coupled with the drain of the first transistor M1. Gate of the seventh transistor M7 is coupled with the first input terminal D. Drain of the seventh transistor M7 is coupled with the drain of the third transistor M3, the drain of the fifth transistor M5, the gate of the fourth transistor M4, and the first output terminal Qn.

Accordingly, when the first control terminal CLK1 and the second control terminal CLK2 are both in high level ("1"), the first transistor M1 and the second transistor M2 are both on. In this case, if the first input terminal D is in low level ("0") and the second input terminal Dn is in high level ("1"), the third transistor M3 and the fifth transistor M5 will be on, the seventh transistor M7 will be off, the fourth transistor M4 and the sixth transistor M6 will be off, thus a first current path from the power supply VREF_1 to the third transistor M3/the fifth transistor M5, the first transistor M1 and the ground wire VREF_2 will be cut off, wherein the first current path is in the first logic unit. Therefore, when the first control terminal CLK1 and the second control terminal CLK2 are both in high level, the static power consumption of the latch will be eliminated, and the dynamic power consumption of the latch will be dramatically reduced.

Figure 6:
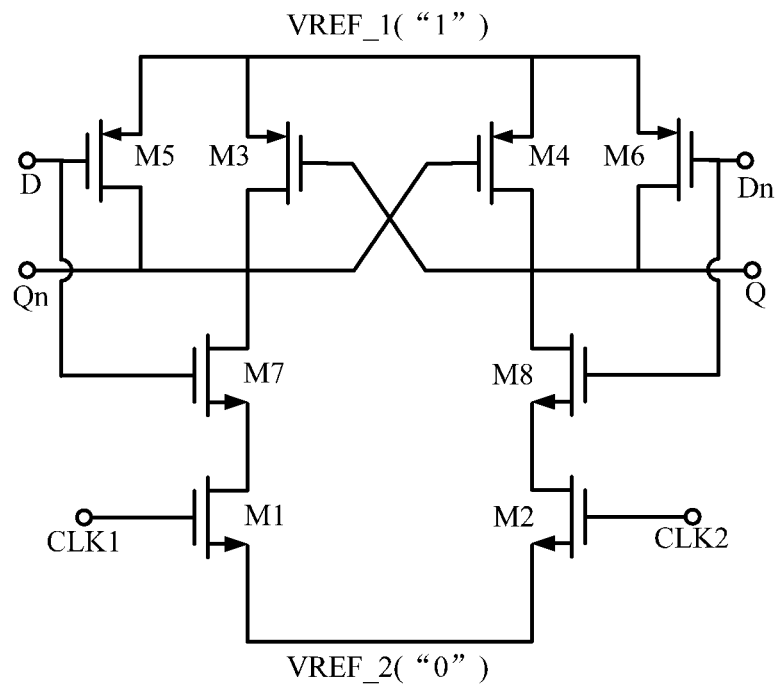

Referring to FIG. 6, a circuit diagram of a latch is illustrated according to one embodiment of the present disclosure. The latch includes a first logic unit, a second logic unit and a first control sub-unit, wherein the first control sub-unit includes a seventh transistor M7 and an eighth transistor M8. Both the seventh transistor M7 and the eighth transistor M8 are NMOS transistors.

In comparison with the latch shown in FIG. 5, the latch shown in FIG. 6 includes the eighth transistor M8 in addition.

Source of the eighth transistor M8 is coupled with the drain of the second transistor M2. Gate of the eighth transistor M8 is coupled with the second input terminal Dn. Drain of the eighth transistor M8 is coupled with the drain of the fourth transistor M4, the drain of the sixth transistor M6, the gate of the third transistor M3, and the second output terminal Q.

Accordingly, when the first control terminal CLK1 and the second control terminal CLK2 are both in high level ("1"), the first transistor M1 and the second transistor M2 are both on. In this case, if the first input terminal D is in low level ("0") and the second input terminal Dn is in high level ("1"), the third transistor M3 and the fifth transistor M5 will be on, the seventh transistor M7 will be off, the fourth transistor M4 and the sixth transistor M6 will be off, and the eighth transistor M8 will be on, thus a first current path from the power supply VREF_1 to the third transistor M3/the fifth transistor M5, the first transistor M1, and the ground wire VREF_2 will be cut off, wherein the first current path is in the first logic unit. Therefore, when the first control terminal CLK1 and the second control terminal CLK2 are both in high level, the static power consumption of the latch will be eliminated, and the dynamic power consumption of the latch will be dramatically reduced.

Figure 7:
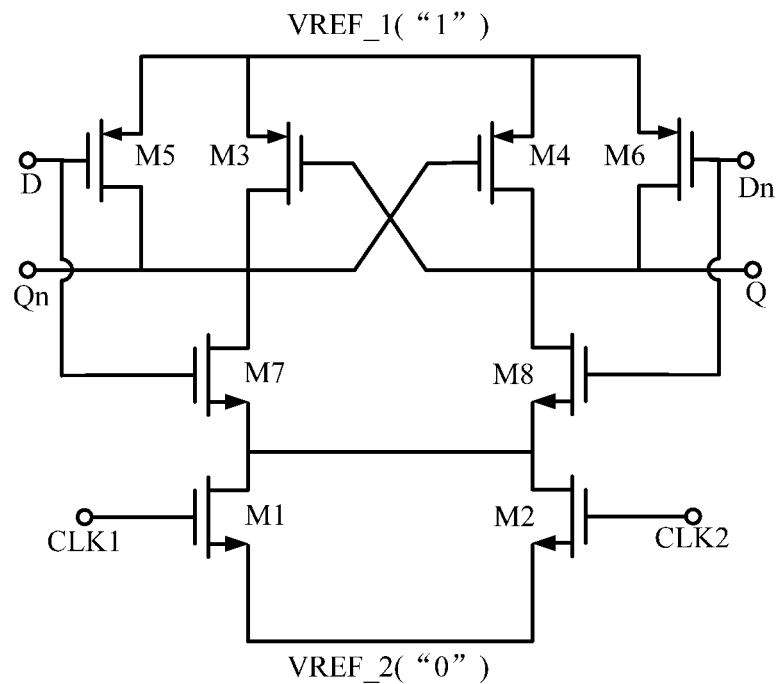

Referring to FIG. 7, a circuit diagram of a latch is illustrated according to one embodiment of the present disclosure. The latch includes a first logic unit, a second logic unit and a first control sub-unit, wherein the first control sub-unit includes a seventh transistor M7 and an eighth transistor M8. The seventh transistor M7 and the eighth transistor M8 are both NMOS transistor.

Structure of the latch shown in FIG. 7 is a modification of that of the latch shown in FIG. 6. Specifically, source of the seventh transistor M7 and source of the eighth transistor M8 are coupled with each other.

Accordingly, when the first control terminal CLK1 and the second control terminal CLK2 are both in high level ("1"), the first transistor M1 and the second transistor M2 are both on. In this case, if the first input terminal D is in low level ("0") and the second input terminal Dn is in high level ("1"), the third transistor M3 and the fifth transistor M5 will be on, the seventh transistor M7 will be off, the fourth transistor M4 and the sixth transistor M6 will be off, and the eighth transistor M8 will be on, thus a first current path from the power supply VREF_1 to the third transistor M3/the fifth transistor M5, the first transistor M1 and the ground wire VREF_2 will be cut off, wherein the first current path is in the first logic unit. Therefore, when the first control terminal CLK1 and the second control terminal CLK2 are both in high level, the static power consumption of the latch will be eliminated, and the dynamic power consumption of the latch will be dramatically reduced.

Figure 8:
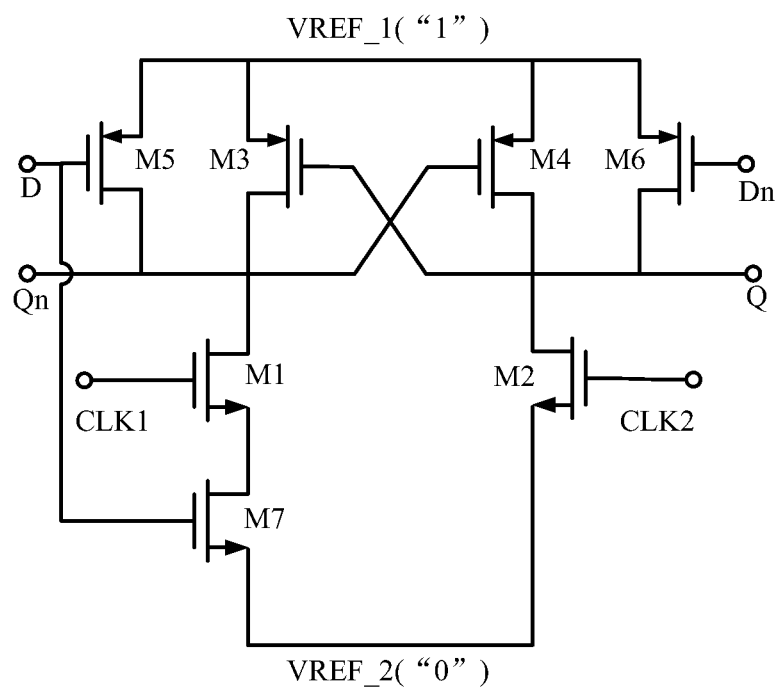

Referring to FIG. 8, a circuit diagram of a latch is illustrated according to one embodiment of the present disclosure. The latch includes a first logic unit, a second logic unit and a first control sub-unit, wherein the first control sub-unit includes a seventh transistor M7. The seventh transistor M7 is a NMOS transistor.

In comparison with the latch shown in FIG. 2, the latch shown in FIG. 8 includes the seventh transistor M7 in addition.

Source of the seventh transistor M7 is coupled with the ground wire VREF_2, gate of the seventh transistor M7 is coupled with the first input terminal D, and drain of the seventh transistor M7 is coupled with the source of the first transistor M1.

Accordingly, when the first control terminal CLK1 and the second control terminal CLK2 are both in high level ("1"), the first transistor M1 and the second transistor M2 are both on. In this case, if the first input terminal D is in low level ("0") and the second input terminal Dn is in high level ("1"), the third transistor M3 and the fifth transistor M5 will be on, the seventh transistor M7 will be off, the fourth transistor M4 and the sixth transistor M6 will be off, thus a first current path from the power supply VREF_1 to the third transistor M3/the fifth transistor M5, the first transistor M1 and the ground wire VREF_2 will be cut off, wherein the first current path is in the first logic unit. Therefore, when the first control terminal CLK1 and the second control terminal CLK2 are both in high level, the static power consumption of the latch will be eliminated, and the dynamic power consumption of the latch will be dramatically reduced.

Figure 9:
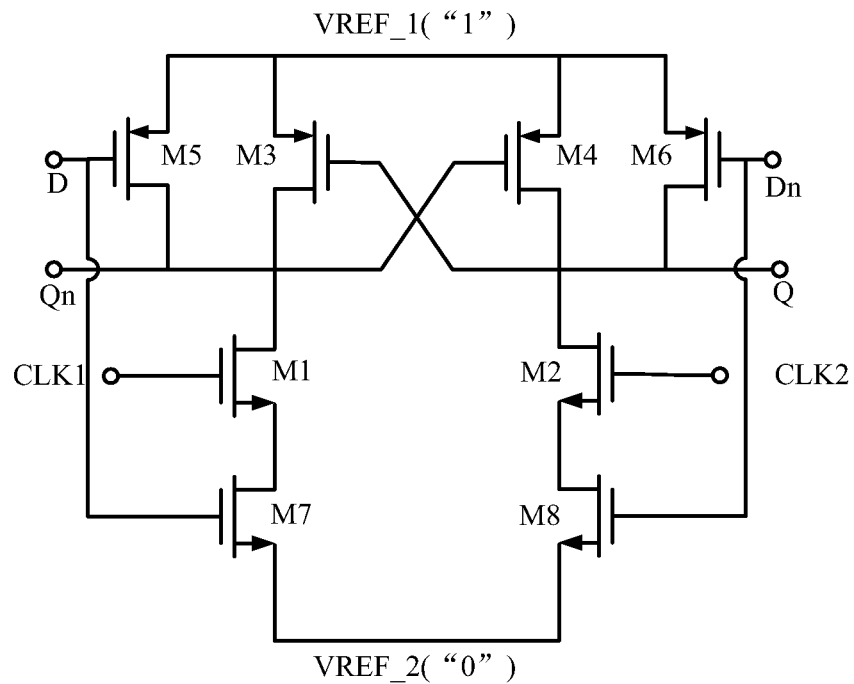

Referring to FIG. 9, a circuit diagram of a latch is illustrated according to one embodiment of the present disclosure. The latch includes a first logic unit, a second logic unit and a first control sub-unit, wherein the first control sub-unit includes a seventh transistor M7 and an eighth transistor M8. The seventh transistor M7 and the eighth transistor M8 are both NMOS transistor.

In comparison with the latch shown in FIG. 8, the latch shown in FIG. 9 includes the eighth transistor M8 in addition.

Source of the eighth transistor M8 is coupled with the ground wire VREF_2, gate of the eighth transistor M8 is coupled with the second input terminal Dn, and drain of the eighth transistor M8 is coupled with the source of the second transistor M2.

Accordingly, when the first control terminal CLK1 and the second control terminal CLK2 are both in high level ("1"), the first transistor M1 and the second transistor M2 are both on. In this case, if the first input terminal D is in low level ("0") and the second input terminal Dn is in high level ("1"), the third transistor M3 and the fifth transistor M5 will be on, the seventh transistor M7 will be off, the fourth transistor M4 and the sixth transistor M6 will be off, and the eighth transistor M8 will be on, thus a first current path from the power supply VREF_1 to the third transistor M3/the fifth transistor M5, the first transistor M1 and the ground wire VREF_2 will be cut off, wherein the first current path is in the first logic unit. Therefore, when the first control terminal CLK1 and the second control terminal CLK2 are both in high level, the static power consumption of the latch will be eliminated, and the dynamic power consumption of the latch will be dramatically reduced.

Figure 10:
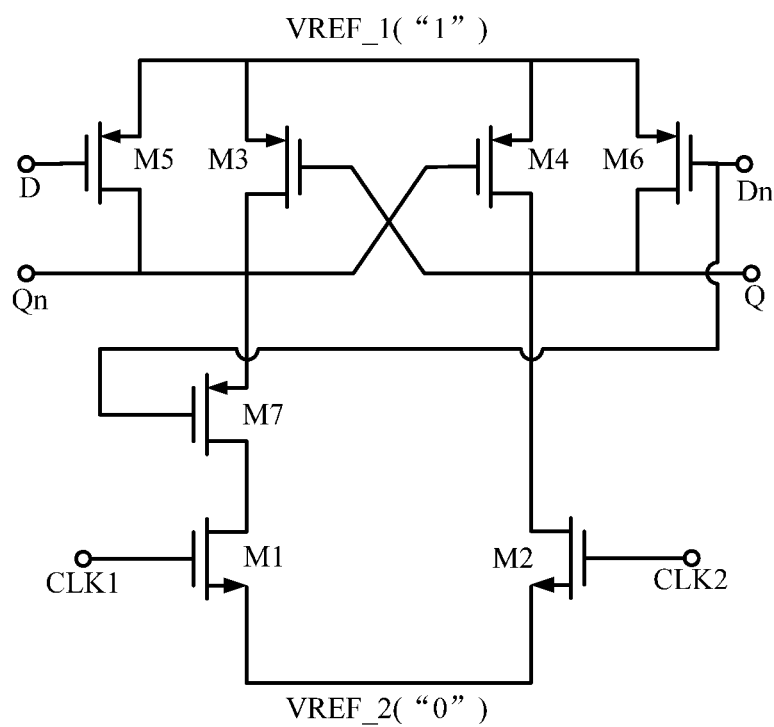

Referring to FIG. 10, a circuit diagram of a latch is illustrated according to one embodiment of the present disclosure. The latch includes a first logic unit, a second logic unit and a first control sub-unit, wherein the first control sub-unit includes a seventh transistor M7.

In comparison with the latch shown in FIG. 2, the latch shown in FIG. 10 includes the seventh transistor M7 in addition. The seventh transistor M7 is a PMOS transistor.

Drain of the seventh transistor M7 is coupled with the drain of the first transistor M1. Gate of seventh transistor M7 is coupled with the second input terminal Dn. Source of the seventh transistor M7 is coupled with the drain of the third transistor M3, the drain of the fifth transistor M5, the gate of the fourth transistor M4, and the first output terminal Qn.

Accordingly, when the first control terminal CLK1 and the second control terminal CLK2 are both in high level ("1"), the first transistor M1 and the second transistor M2 are both on. In this case, if the first input terminal D is in low level ("0") and the second input terminal Dn is in high level ("1"), the third transistor M3 and the fifth transistor M5 will be on, the seventh transistor M7 will be off, the fourth transistor M4 and the sixth transistor M6 will be off, thus a first current path from the power supply VREF_1 to the third transistor M3/the fifth transistor M5, the first transistor M1 and the ground wire VREF_2 will be cut off, wherein the first current path is in the first logic unit. Therefore, when the first control terminal CLK1 and the second control terminal CLK2 are both in high level, the static power consumption of the latch will be eliminated, and the dynamic power consumption of the latch will be dramatically reduced.

Figure 11:
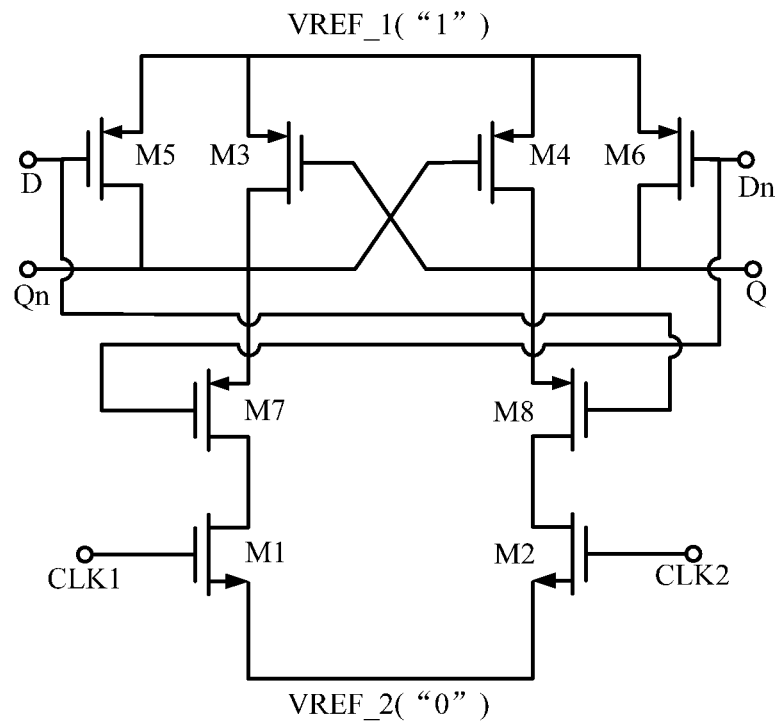

Referring to FIG. 11, a circuit diagram of a latch is illustrated according to one embodiment of the present disclosure. The latch includes a first logic unit, a second logic unit and a first control sub-unit, wherein the first control sub-unit includes a seventh transistor M7 and an eighth transistor M8. The seventh transistor M7 and the eighth transistor M8 are both PMOS transistor.

In comparison with the latch shown in FIG. 10, the latch shown in FIG. 11 includes the eighth transistor M8 in addition.

Drain of the eighth transistor M8 is coupled with the drain of the second transistor M2. Gate of the eighth transistor M8 is coupled with the first input terminal D. Source of the eighth transistor M8 is coupled with the drain of the fourth transistor M4, the drain of the sixth transistor M6, the gate of the third transistor M3 and the second output terminal Q.

Accordingly, when the first control terminal CLK1 and the second control terminal CLK2 are both in high level ("1"), the first transistor M1 and the second transistor M2 are both on. In this case, if the first input terminal D is in low level ("0") and the second input terminal Dn is in high level ("1"), the third transistor M3 and the fifth transistor M5 will be on, the seventh transistor M7 will be off, the fourth transistor M4 and the sixth transistor M6 will be off, and the eighth transistor M8 will be on, thus a first current path from the power supply VREF_1 to the third transistor M3/the fifth transistor M5, the first transistor M1 and the ground wire VREF_2 will be cut off, wherein the first current path is in the first logic unit. Therefore, when the first control terminal CLK1 and the second control terminal CLK2 are both in high level, the static power consumption of the latch will be eliminated, and the dynamic power consumption of the latch will be dramatically reduced.

Figure 12:
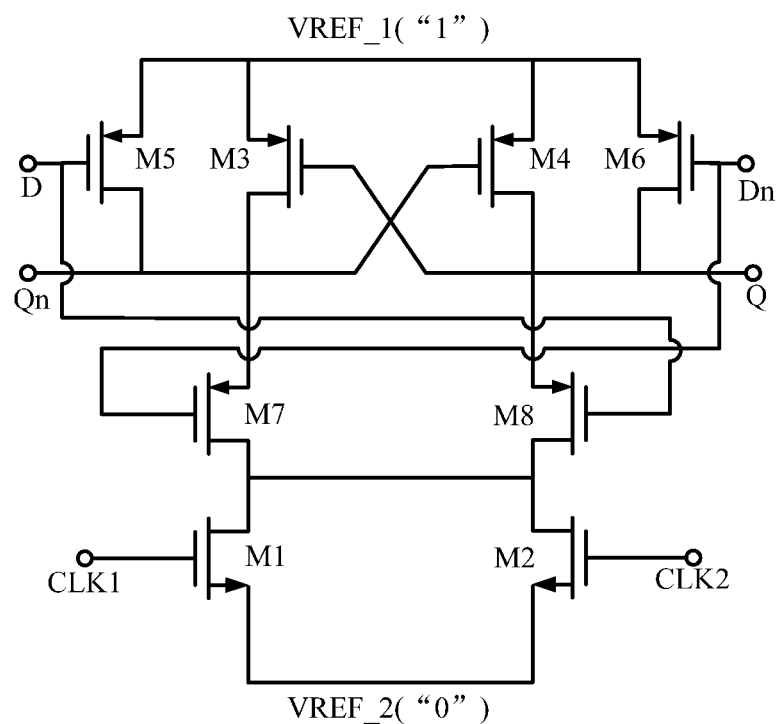

Referring to FIG. 12, a circuit diagram of a latch is illustrated according to one embodiment of the present disclosure. The latch includes a first logic unit, a second logic unit and a first control sub-unit, wherein the first control sub-unit includes a seventh transistor M7 and an eighth transistor M8. The seventh transistor M7 and the eighth transistor M8 are both PMOS transistor.

Structure of the latch shown in FIG. 12 is a modification of that of the latch shown in FIG. 11. Specifically, source of the seventh transistor M7 and source of the eighth transistor M8 are coupled with each other.

Accordingly, when the first control terminal CLK1 and the second control terminal CLK2 are both in high level ("1"), the first transistor M1 and the second transistor M2 are both on. In this case, if the first input terminal D is in low level ("0") and the second input terminal Dn is in high level ("1"), the third transistor M3 and the fifth transistor M5 will be on, the seventh transistor M7 will be off, the fourth transistor M4 and the sixth transistor M6 will be off, and the eighth transistor M8 will be on, thus a first current path from the power supply VREF_1 to the third transistor M3/the fifth transistor M5, the first transistor M1 and the ground wire VREF_2 will be cut off, wherein the first current path is in the first logic unit. Therefore, when the first control terminal CLK1 and the second control terminal CLK2 are both in high level, the static power consumption of the latch will be eliminated, and the dynamic power consumption of the latch will be dramatically reduced.

Figure 13:
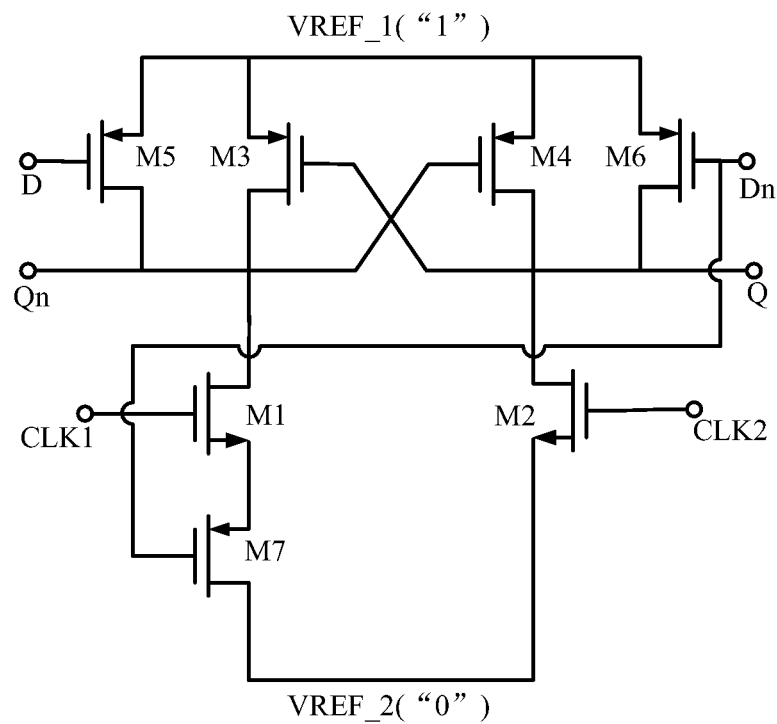

Referring to FIG. 13, a circuit diagram of a latch is illustrated according to one embodiment of the present disclosure. The latch includes a first logic unit, a second logic unit and a first control sub-unit, wherein the first control sub-unit includes a seventh transistor M7. The seventh transistor M7 is a PMOS transistor.

In comparison with the latch shown in FIG. 2, the latch shown in FIG. 13 includes the seventh transistor M7 in addition.

Drain of the seventh transistor M7 is coupled with the ground wire VREF_2, gate of the seventh transistor M7 is coupled with the second input terminal Dn, and source of the seventh transistor M7 is coupled with the source of the first transistor M1.

Accordingly, when the first control terminal CLK1 and the second control terminal CLK2 are both in high level ("1"), the first transistor M1 and the second transistor M2 are both on. In this case, if the first input terminal D is in low level ("0") and the second input terminal Dn is in high level ("1"), the third transistor M3 and the fifth transistor M5 will be on, the seventh transistor M7 will be off, the fourth transistor M4 and the sixth transistor M6 will be off, thus a first current path from the power supply VREF_1 to the third transistor M3/the fifth transistor M5, the first transistor M1 and the ground wire VREF_2 will be cut off, wherein the first current path is in the first logic unit. Therefore, when the first control terminal CLK1 and the second control terminal CLK2 are both in high level, the static power consumption of the latch will be eliminated, and the dynamic power consumption of the latch will be dramatically reduced.

Figure 14:
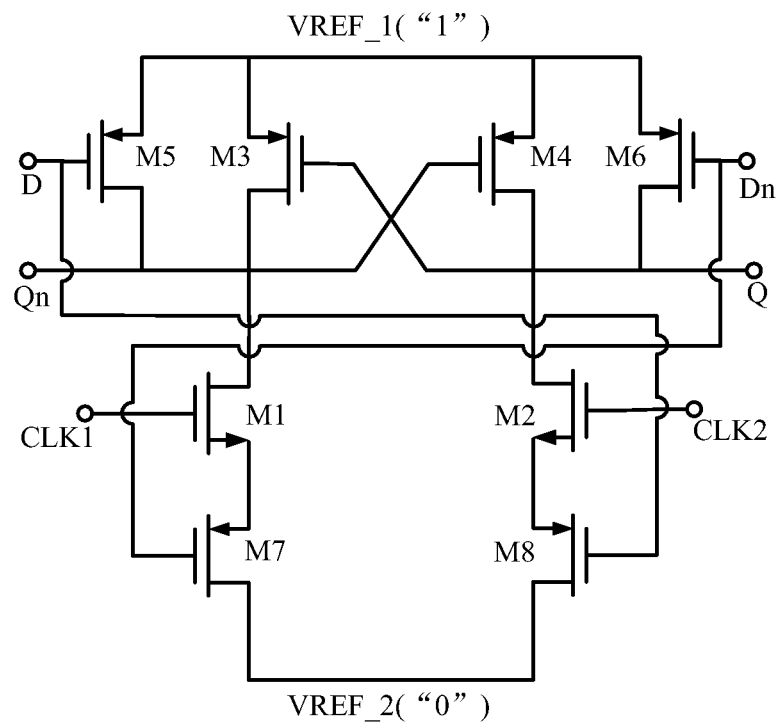

Referring to FIG. 14, a circuit diagram of a latch is illustrated according to one embodiment of the present disclosure. The latch includes a first logic unit, a second logic unit and a first control sub-unit, wherein the first control sub-unit includes a seventh transistor M7 and an eighth transistor M8. The seventh transistor M7 and the eighth transistor M8 are both PMOS transistor.

In comparison with the latch shown in FIG. 13, the latch shown in FIG. 14 includes the eighth transistor M8 in addition.

Drain of the eighth transistor M8 is coupled with the ground wire VREF_2, gate of the eighth transistor M8 is coupled with the first input terminal D, and source of the eighth transistor M8 is coupled with the source of the second transistor M2.

Accordingly, when the first control terminal CLK1 and the second control terminal CLK2 are both in high level ("1"), the first transistor M1 and the second transistor M2 are both on. In this case, if the first input terminal D is in low level ("0") and the second input terminal Dn is in high level ("1"), the third transistor M3 and the fifth transistor M5 will be on, the seventh transistor M7 will be off, the fourth transistor M4 and the sixth transistor M6 will be off, and the eighth transistor M8 will be on, thus a first current path from the power supply VREF_1 to the third transistor M3/the fifth transistor M5, the first transistor M1 and the ground wire VREF_2 will be cut off, wherein the first current path is in the first logic unit. Therefore, when the first control terminal CLK1 and the second control terminal CLK2 are both in high level, the static power consumption of the latch will be eliminated, and the dynamic power consumption of the latch will be dramatically reduced.

Figure 15:
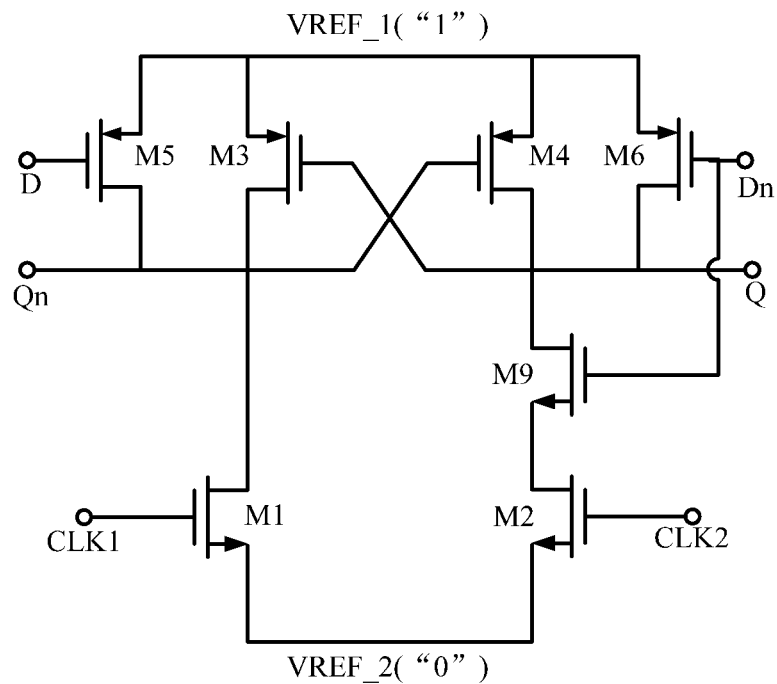

Referring to FIG. 15, a circuit diagram of a latch is illustrated according to one embodiment of the present disclosure. The latch includes a first logic unit, a second logic unit and a second control sub-unit, wherein the second control sub-unit includes a ninth transistor M9. The ninth transistor M9 is a NMOS transistor.

In comparison with the latch shown in FIG. 2, the latch shown in FIG. 15 includes the ninth transistor M9 in addition.

Source of the ninth transistor M9 is coupled with the drain of the second transistor M2. Gate of the ninth transistor M9 is coupled with the second input terminal Dn. Drain of the ninth transistor M9 is coupled with the drain of the fourth transistor M4, the drain of the sixth transistor M6, the gate of the third transistor M3, and the second output terminal Q.

Accordingly, when the first control terminal CLK1 and the second control terminal CLK2 are both in high level ("1"), the first transistor M1 and the second transistor M2 are both on. In this case, if the first input terminal D is in high level ("1") and the second input terminal Dn is in low level ("0"), the fourth transistor M4 and the sixth transistor M6 will be on, the ninth transistor M9 will be off, the third transistor M3 and the fifth transistor M5 will be off, thus a second current path from the power supply VREF_1 to the fourth transistor M4/the sixth transistor M6, the second transistor M2 and the ground wire VREF_2 will be cut off, wherein the second current path is in the second logic unit. Therefore, when the first control terminal CLK1 and the second control terminal CLK2 are both in high level, the static power consumption of the latch will be eliminated, and the dynamic power consumption of the latch will be dramatically reduced.

Figure 16:
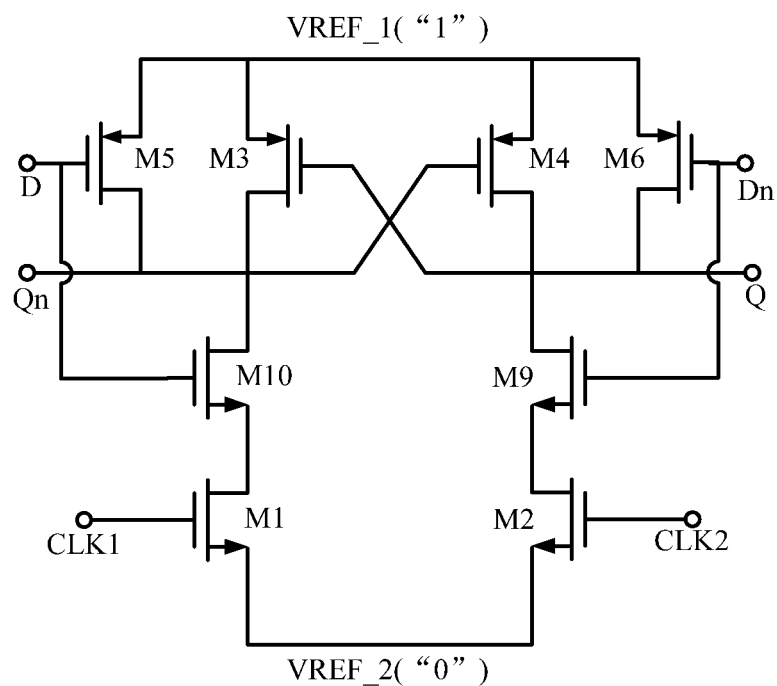

Referring to FIG. 16, a circuit diagram of a latch is illustrated according to one embodiment of the present disclosure. The latch includes a first logic unit, a second logic unit and a second control sub-unit, wherein the second control sub-unit includes a ninth transistor M9 and a tenth transistor M10. The ninth transistor M9 and the tenth transistor M10 are both NMOS transistor.

In comparison with the latch shown in FIG. 15, the latch shown in FIG. 16 includes the tenth transistor M10 in addition.

Source of the tenth transistor M10 is coupled with the drain of the first transistor M1. Gate of the tenth transistor M10 is coupled with the first input terminal D. Drain of the tenth transistor M10 is coupled with the drain of the third transistor M3, the drain of the fifth transistor M5, the gate of the fourth transistor M4, and the first output terminal Qn.

Accordingly, when the first control terminal CLK1 and the second control terminal CLK2 are both in high level ("1"), the first transistor M1 and the second transistor M2 are both on. In this case, if the first input terminal D is in high level ("1") and the second input terminal Dn is in low level ("0"), the fourth transistor M4 and the sixth transistor M6 will be on, the ninth transistor M9 will be off, the third transistor M3 and the fifth transistor M5 will be off, and the tenth transistor M10 will be on, thus a second current path from the power supply VREF_1 to the fourth transistor M4/the sixth transistor M6, the second transistor M2 and the ground wire VREF_2 will be cut off, wherein the second current path is in the second logic unit. Therefore, when the first control terminal CLK1 and the second control terminal CLK2 are both in high level, the static power consumption of the latch will be eliminated, and the dynamic power consumption of the latch will be dramatically reduced.

Figure 17:
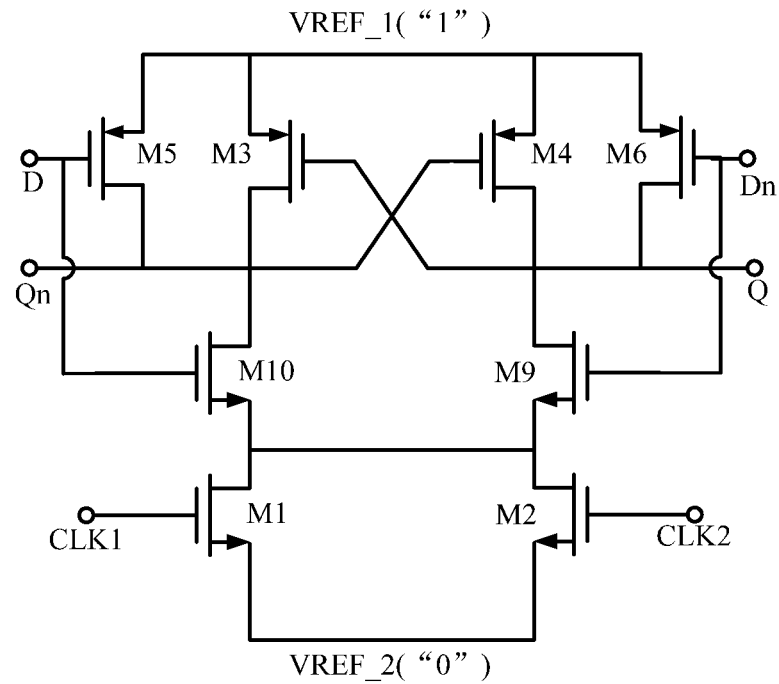

Referring to FIG. 17, a circuit diagram of a latch is illustrated according to one embodiment of the present disclosure. The latch includes a first logic unit, a second logic unit and a second control sub-unit, wherein the second control sub-unit includes a ninth transistor M9 and a tenth transistor M10. The ninth transistor M9 and the tenth transistor M10 are both NMOS transistor.

Structure of the latch shown in FIG. 17 is a modification of that of the latch shown in FIG. 16. Specifically, source of the ninth transistor M9 and source of the tenth transistor M10 are coupled with each other.

Accordingly, when the first control terminal CLK1 and the second control terminal CLK2 are both in high level ("1"), the first transistor M1 and the second transistor M2 are both on. In this case, if the first input terminal D is in high level ("1") and the second input terminal Dn is in low level ("0"), the fourth transistor M4 and the sixth transistor M6 will be on, the ninth transistor M9 will be off, the third transistor M3 and the fifth transistor M5 will be off, and the tenth transistor M10 will be on, thus a second current path from the power supply VREF_1 to the fourth transistor M4/the sixth transistor M6, the second transistor M2 and the ground wire VREF_2 will be cut off, wherein the second current path is in the second logic unit. Therefore, when the first control terminal CLK1 and the second control terminal CLK2 are both in high level, the static power consumption of the latch will be eliminated, and the dynamic power consumption of the latch will be dramatically reduced.

Figure 18:
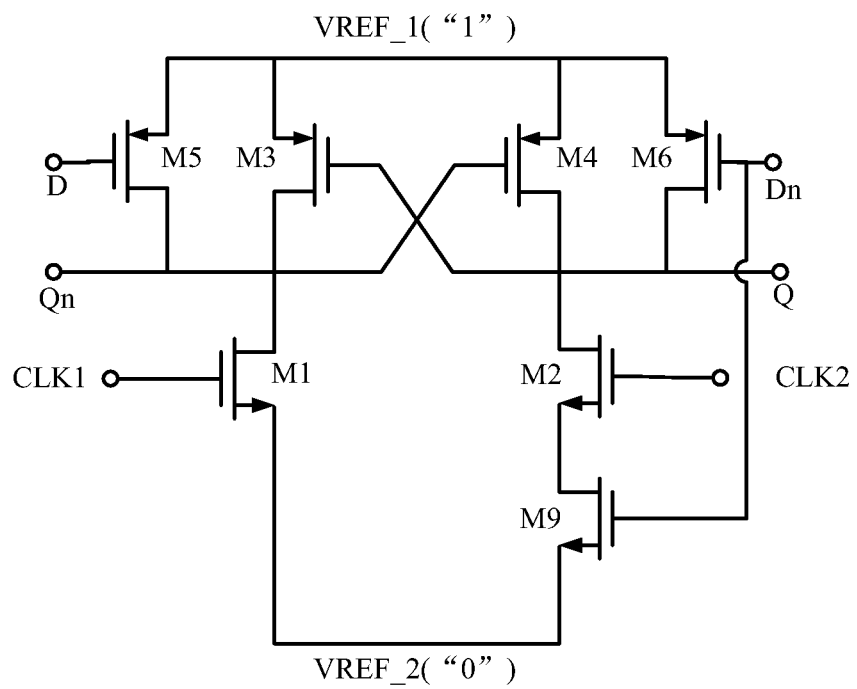

Referring to FIG. 18, a circuit diagram of a latch is illustrated according to one embodiment of the present disclosure. The latch includes a first logic unit, a second logic unit and a second control sub-unit, wherein the second control sub-unit includes a ninth transistor M9. The ninth transistor M9 is a NMOS transistor.

In comparison with the latch shown in FIG. 2, the latch shown in FIG. 18 includes the ninth transistor M9 in addition.

Source of the ninth transistor M9 is coupled with the ground wire VREF_2, gate of the ninth transistor M9 is coupled with the second input terminal Dn, and drain of the ninth transistor M9 is coupled with the source of the second transistor M2.

Accordingly, when the first control terminal CLK1 and the second control terminal CLK2 are both in high level ("1"), the first transistor M1 and the second transistor M2 are both on. In this case, if the first input terminal D is in high level ("1") and the second input terminal Dn is in low level ("0"), the fourth transistor M4 and the sixth transistor M6 will be on, the ninth transistor M9 will be off, the third transistor M3 and the fifth transistor M5 will be off, thus a second current path from the power supply VREF_1 to the fourth transistor M4/the sixth transistor M6, the second transistor M2 and the ground wire VREF_2 will be cut off, wherein the second current path is in the second logic unit. Therefore, when the first control terminal CLK1 and the second control terminal CLK2 are both in high level, the static power consumption of the latch will be eliminated, and the dynamic power consumption of the latch will be dramatically reduced.

Figure 19:
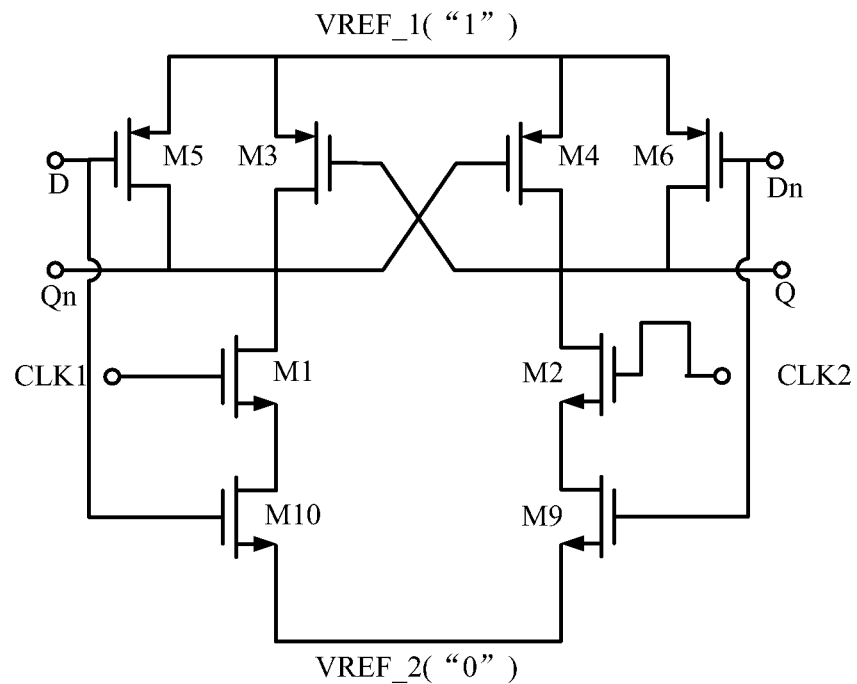

Referring to FIG. 19, a circuit diagram of a latch is illustrated according to one embodiment of the present disclosure. The latch includes a first logic unit, a second logic unit and a second control sub-unit, wherein the second control sub-unit includes a ninth transistor M9 and a tenth transistor M10. The ninth transistor M9 and the tenth transistor M10 are both NMOS transistor.

In comparison with the latch shown in FIG. 18, the latch shown in FIG. 19 includes the tenth transistor M10 in addition.

Source of the tenth transistor M10 is coupled with the ground wire VREF_2, gate of the tenth transistor M10 is coupled with the first input terminal D, and drain of the tenth transistor M10 is coupled with the source of the first transistor M1.

Accordingly, when the first control terminal CLK1 and the second control terminal CLK2 are both in high level ("1"), the first transistor M1 and the second transistor M2 are both on. In this case, if the first input terminal D is in high level ("1") and the second input terminal Dn is in low level ("0"), the fourth transistor M4 and the sixth transistor M6 will be on, the ninth transistor M9 will be off, the third transistor M3 and the fifth transistor M5 will be off, and the tenth transistor M10 will be on, thus a second current path from the power supply VREF_1 to the fourth transistor M4/the sixth transistor M6, the second transistor M2 and the ground wire VREF_2 will be cut off, wherein the second current path is in the second logic unit. Therefore, when the first control terminal CLK1 and the second control terminal CLK2 are both in high level, the static power consumption of the latch will be eliminated, and the dynamic power consumption of the latch will be dramatically reduced.

Figure 20:
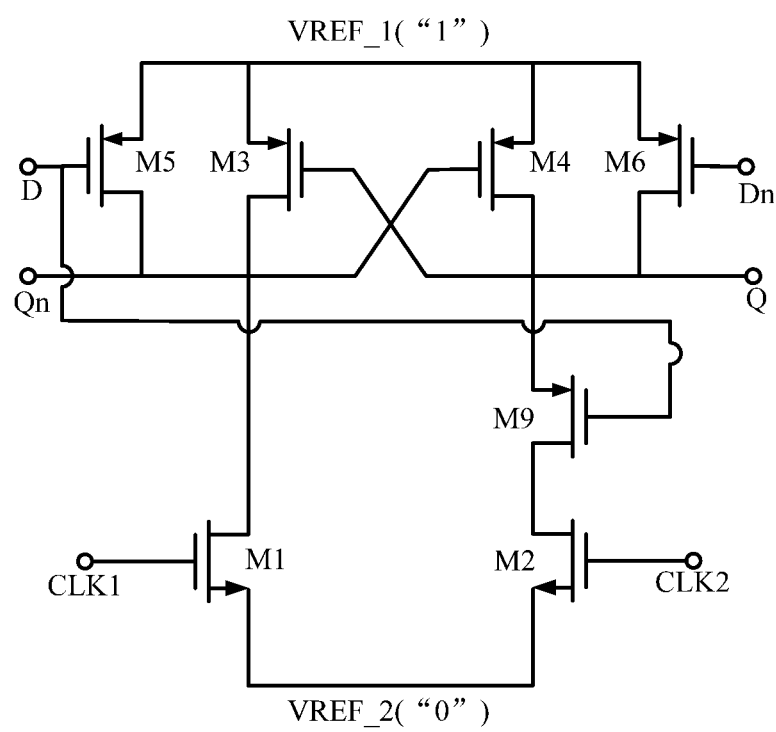

Referring to FIG. 20, a circuit diagram of a latch is illustrated according to one embodiment of the present disclosure. The latch includes a first logic unit, a second logic unit and a second control sub-unit, wherein the second control sub-unit includes a ninth transistor M9.

In comparison with the latch shown in FIG. 2, the latch shown in FIG. 20 includes the ninth transistor M9 in addition. Furthermore, the ninth transistor M9 is a PMOS transistor.

Drain of the ninth transistor M9 is coupled with the drain of the second transistor M2. Gate of the ninth transistor M9 is coupled with the first input terminal D. Source of the ninth transistor M9 is coupled with the drain of the fourth transistor M4, the drain of the sixth transistor M6, the gate of the third transistor M3, and the second output terminal Q.

Accordingly, when the first control terminal CLK1 and the second control terminal CLK2 are both in high level ("1"), the first transistor M1 and the second transistor M2 are both on. In this case, if the first input terminal D is in high level ("1") and the second input terminal Dn is in low level ("0"), the fourth transistor M4 and the sixth transistor M6 will be on, the ninth transistor M9 will be off, the third transistor M3 and the fifth transistor M5 will be off, thus a second current path from the power supply VREF_1 to the fourth transistor M4/the sixth transistor M6, the second transistor M2 and the ground wire VREF_2 will be cut off, wherein the second current path is in the second logic unit. Therefore, when the first control terminal CLK1 and the second control terminal CLK2 are both in high level, the static power consumption of the latch will be eliminated, and the dynamic power consumption of the latch will be dramatically reduced.

Figure 21:
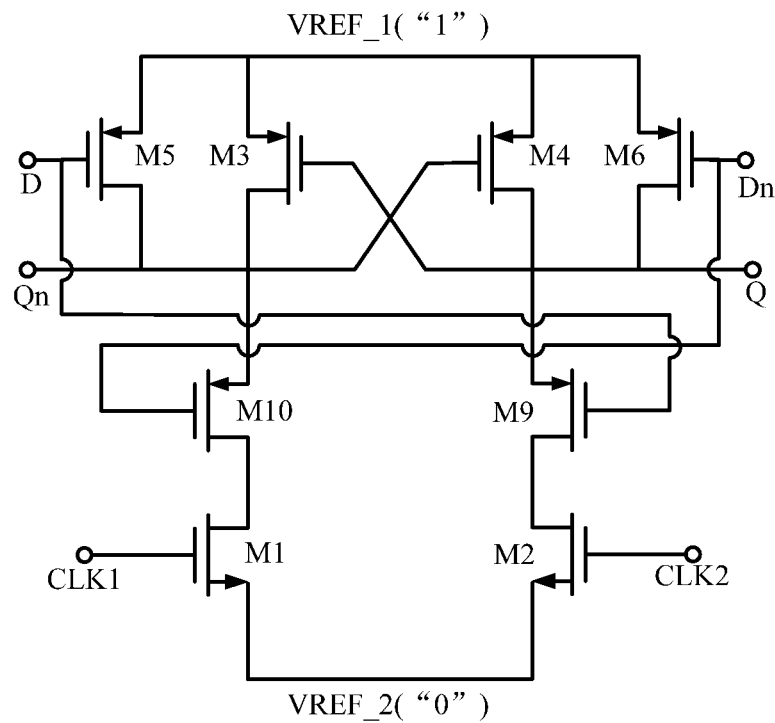

Referring to FIG. 21, a circuit diagram of a latch is illustrated according to one embodiment of the present disclosure. The latch includes a first logic unit, a second logic unit and a second control sub-unit, wherein the second control sub-unit includes a ninth transistor M9 and a tenth transistor M10. The ninth transistor M9 and the tenth transistor M10 are both PMOS transistor.

In comparison with the latch shown in FIG. 20, the latch shown in FIG. 21 includes the tenth transistor M10 in addition.

Drain of the tenth transistor M10 is coupled with the drain of the first transistor M1. Gate of the tenth transistor M10 is coupled with the second input terminal Dn. Source of the tenth transistor M10 is coupled with the drain of the third transistor M3, the drain of the fifth transistor M5, the gate of the fourth transistor M4, and the first output terminal Qn.

Accordingly, when the first control terminal CLK1 and the second control terminal CLK2 are both in high level ("1"), the first transistor M1 and the second transistor M2 are both on. In this case, if the first input terminal D is in high level ("1") and the second input terminal Dn is in low level ("0"), the fourth transistor M4 and the sixth transistor M6 will be on, the ninth transistor M9 will be off, the third transistor M3 and the fifth transistor M5 will be off, and the tenth transistor M10 will be on, thus a second current path from the power supply VREF_1 to the fourth transistor M4/the sixth transistor M6, the second transistor M2 and the ground wire VREF_2 will be cut off, wherein the second current path is in the second logic unit. Therefore, when the first control terminal CLK1 and the second control terminal CLK2 are both in high level, the static power consumption of the latch will be eliminated, and the dynamic power consumption of the latch will be dramatically reduced.

Figure 22:
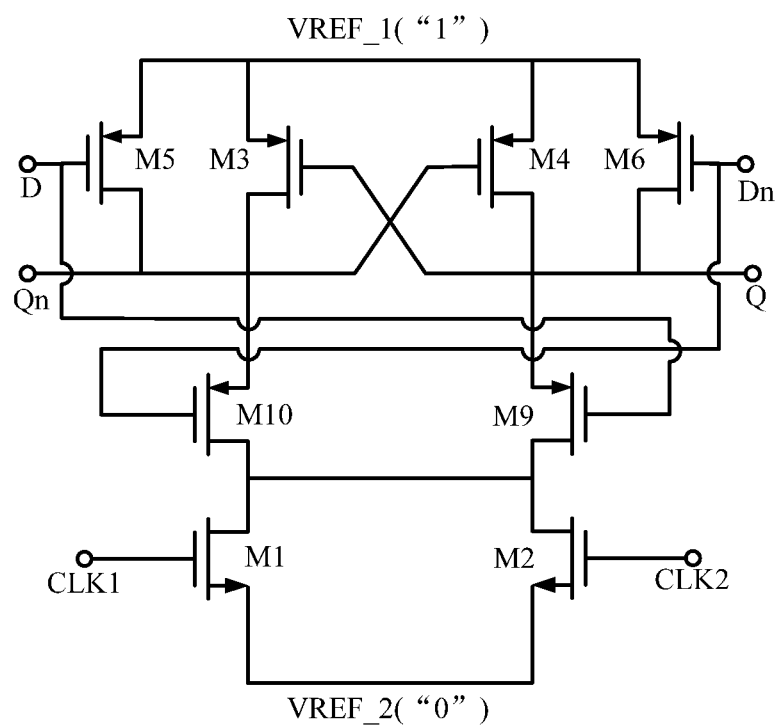

Referring to FIG. 22, a circuit diagram of a latch is illustrated according to one embodiment of the present disclosure. The latch includes a first logic unit, a second logic unit and a second control sub-unit, wherein the second control sub-unit includes a ninth transistor M9 and a tenth transistor M10.

Structure of the latch shown in FIG. 22 is a modification of that of the latch shown in FIG. 21. Specifically, source of the ninth transistor M9 and source of the tenth transistor M10 are coupled with each other.

Accordingly, when the first control terminal CLK1 and the second control terminal CLK2 are both in high level ("1"), the first transistor M1 and the second transistor M2 are both on. In this case, if the first input terminal D is in high level ("1") and the second input terminal Dn is in low level ("0"), the fourth transistor M4 and the sixth transistor M6 will be on, the ninth transistor M9 will be off, the third transistor M3 and the fifth transistor M5 will be off, and the tenth transistor M10 will be on, thus a second current path from the power supply VREF_1 to the fourth transistor M4/the sixth transistor M6, the second transistor M2 and the ground wire VREF_2 will be cut off, wherein the second current path is in the second logic unit. Therefore, when the first control terminal CLK1 and the second control terminal CLK2 are both in high level, the static power consumption of the latch will be eliminated, and the dynamic power consumption of the latch will be dramatically reduced.

Figure 23:
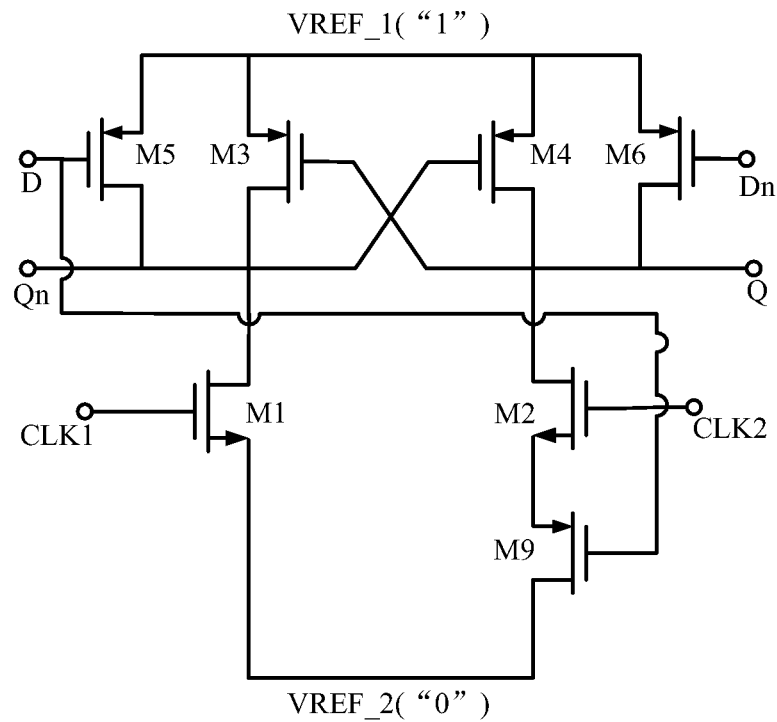

Referring to FIG. 23, a circuit diagram of a latch is illustrated according to one embodiment of the present disclosure. The latch includes a first logic unit, a second logic unit and a second control sub-unit, wherein the second control sub-unit includes a ninth transistor M9.

In comparison with the latch shown in FIG. 2, the latch shown in FIG. 23 includes the ninth transistor M9 in addition. Furthermore, the ninth transistor M9 is a PMOS transistor.

Drain of the ninth transistor M9 is coupled with the ground wire VREF_2, gate of the ninth transistor M9 is coupled with the first input terminal D, and source of the ninth transistor M9 is coupled with the source of the second transistor M2.

Accordingly, when the first control terminal CLK1 and the second control terminal CLK2 are both in high level ("1"), the first transistor M1 and the second transistor M2 are both on. In this case, if the first input terminal D is in high level ("1") and the second input terminal Dn is in low level ("0"), the fourth transistor M4 and the sixth transistor M6 will be on, the ninth transistor M9 will be off, the third transistor M3 and the fifth transistor M5 will be off, thus a second current path from the power supply VREF_1 to the fourth transistor M4/the sixth transistor M6, the second transistor M2 and the ground wire VREF_2 will be cut off, wherein the second current path is in the second logic unit. Therefore, when the first control terminal CLK1 and the second control terminal CLK2 are both in high level, the static power consumption of the latch will be eliminated, and the dynamic power consumption of the latch will be dramatically reduced.

Figure 24:
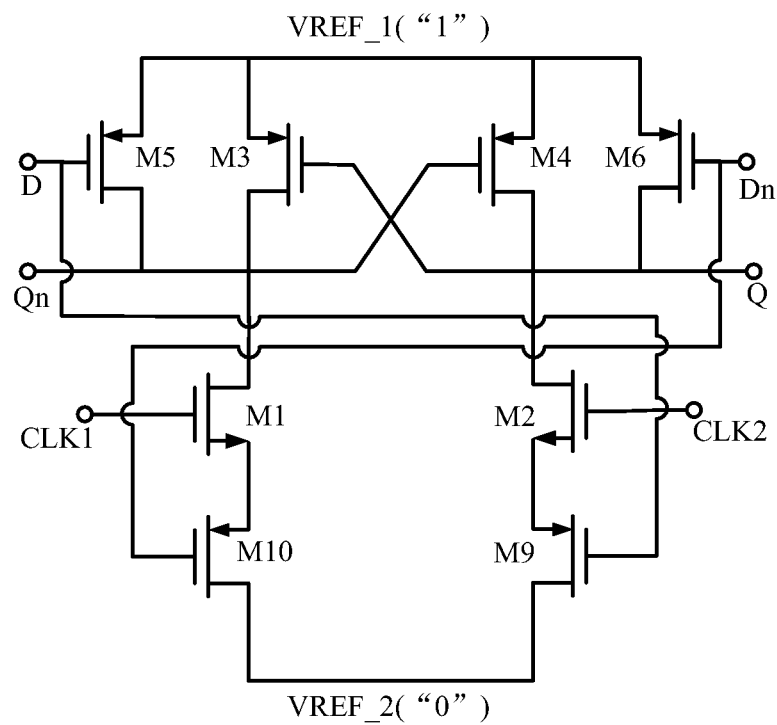

Referring to FIG. 24, a circuit diagram of a latch is illustrated according to one embodiment of the present disclosure. The latch includes a first logic unit, a second logic unit and a second control sub-unit, wherein the second control sub-unit includes a ninth transistor M9 and a tenth transistor M10. The ninth transistor M9 and the tenth transistor M10 are both NMOS transistor.

In comparison with the latch shown in FIG. 23, the latch shown in FIG. 24 includes the tenth transistor M10 in addition.

Drain of the tenth transistor M10 is coupled with the ground wire VREF_2, gate of the tenth transistor M10 is coupled with the second input terminal Dn, and source of the tenth transistor M10 is coupled with the source of the first transistor M1.

Accordingly, when the first control terminal CLK1 and the second control terminal CLK2 are both in high level ("1"), the first transistor M1 and the second transistor M2 are both on. In this case, if the first input terminal D is in high level ("1") and the second input terminal Dn is in low level ("0"), the fourth transistor M4 and the sixth transistor M6 will be on, the ninth transistor M9 will be off, the third transistor M3 and the fifth transistor M5 will be off, and the tenth transistor M10 will be on, thus a second current path from the power supply VREF_1 to the fourth transistor M4/the sixth transistor M6, the second transistor M2 and the ground wire VREF_2 will be cut off, wherein the second current path is in the second logic unit. Therefore, when the first control terminal CLK1 and the second control terminal CLK2 are both in high level, the static power consumption of the latch will be eliminated, and the dynamic power consumption of the latch will be dramatically reduced.

Accordingly, a frequency divider is also provided by the present disclosure, which includes at least two of the latches described above. The at least two of the latches include a first latch and a second latch. The first input terminal and the second input terminal of the first latch are respectively coupled with the first output terminal and the second output terminal of the second latch.

Although the present disclosure has been disclosed above with reference to preferred embodiments thereof, it should be understood by those skilled in the art that various changes may be made without departing from the spirit or scope of the disclosure. Accordingly, the present disclosure is not limited to the embodiments disclosed.

What is claimed is:

1. A latch, comprising:
   a first logic unit coupled between a power supply and a ground wire, wherein the first logic unit comprises a first control terminal, a first input terminal and a first output terminal;
   a second logic unit having a structure symmetrical to that of the first logic unit, wherein the second logic unit comprises a second control terminal, a second input terminal and a second output terminal; and
   a feedforward control unit adapted for cutting off a current path in the first logic unit or the second logic unit based on signals inputted into the first input terminal and the second input terminal,
   wherein the first logic unit comprises a first transistor, a third transistor and a fifth transistor, and the second logic unit comprises a second transistor, a fourth transistor and a sixth transistor,
   wherein a source of the first transistor is coupled with the ground wire, a gate of the first transistor is coupled with the first control terminal, a drain of the first transistor is coupled with a drain of the third transistor, a drain of the fifth transistor, a gate of the fourth transistor and the first output terminal;
   wherein a source of the second transistor is coupled with the ground wire, a gate of the second transistor is coupled with the second control terminal, a drain of the second transistor is coupled with a drain of the fourth transistor, a drain of the sixth transistor, a gate of the third transistor and the second output terminal; and
   wherein the third transistor and the fifth transistor are connected in parallel, the fourth transistor and the sixth transistor are connected in parallel, and sources of the third transistor, the fourth transistor, the fifth transistor and the sixth transistor are coupled with the power supply.

2. The latch according to claim 1, wherein the feedforward control unit comprises at least one of a first control sub-unit or a second control sub-unit,
   wherein the first control sub-unit is adapted for cutting off a first current path in the first logic unit, when a signal inputted into the first input terminal is in low level and a signal inputted into the second input terminal is in high level; and
   wherein the second control sub-unit is adapted for cutting off a second current path in the second logic unit, when a signal inputted into the first input terminal is in high level and a signal inputted into the second input terminal is in low level.

3. A latch, comprising:
   a first logic unit coupled between a power supply and a ground wire, wherein the first logic unit comprises a first control terminal, a first input terminal and a first output terminal;
   a second logic unit having a structure symmetrical to that of the first logic unit, wherein the second logic unit comprises a second control terminal, a second input terminal and a second output terminal; and
   a feedforward control unit adapted for cutting off a current path in the first logic unit or the second logic unit based on signals inputted into the first input terminal and the second input terminal,
   wherein the feedforward control unit comprises at least one of a first control sub-unit or a second control sub-unit,
   wherein the first control sub-unit is adapted for cutting off a first current path in the first logic unit, when a signal inputted into the first input terminal is in low level and a signal inputted into the second input terminal is in high level;

wherein the second control sub-unit is adapted for cutting off a second current path in the second logic unit, when a signal inputted into the first input terminal is in high level and a signal inputted into the second input terminal is in low level, wherein the first logic unit comprises a first transistor, a third transistor and a fifth transistor, and the second logic unit comprises a second transistor, a fourth transistor and a sixth transistor, wherein a source of the first transistor is coupled with the ground wire, a gate of the first transistor is coupled with the first control terminal, a drain of the first transistor is coupled with a drain of the third transistor, a drain of the fifth transistor, a gate of the fourth transistor and the first output terminal;

wherein a source of the second transistor is coupled with the ground wire, a gate of the second transistor is coupled with the second control terminal, a drain of the second transistor is coupled with a drain of the fourth transistor, a drain of the sixth transistor, a gate of the third transistor and the second output terminal; and wherein sources of the third transistor, the fourth transistor, the fifth transistor and the sixth transistor are coupled with the power supply;

wherein the first control sub-unit comprises a seventh transistor which is an NMOS transistor, wherein a source of the seventh transistor is coupled with the drain of the first transistor, a gate of the seventh transistor is coupled with the first input terminal, and a drain of the seventh transistor is coupled with the drain of the third transistor, the drain of the fifth transistor, the gate of the fourth transistor and the first output terminal.

4. The latch according to claim 3, wherein the first control sub-unit further comprises an eighth transistor which is an NMOS transistor, wherein a source of the eighth transistor is coupled with the drain of the second transistor, a gate of the eighth transistor is coupled with the second input terminal, a drain of the eighth transistor is coupled with the drain of the fourth transistor, the drain of the sixth transistor, the gate of the third transistor and the second output terminal.

5. The latch according to claim 4, wherein the source of the seventh transistor and the source of the eighth transistor are coupled with each other.

6. The latch according to claim 2, wherein the first control sub-unit comprises a seventh transistor which is an NMOS transistor, wherein a source of the seventh transistor is coupled with the ground wire, a gate of the seventh transistor is coupled with the first input terminal, and a drain of the seventh transistor is coupled with the source of the first transistor.

7. The latch according to claim 6, wherein the first control sub-unit further comprises an eighth transistor which is an NMOS transistor, wherein a source of the eighth transistor is coupled with the ground wire, a gate of the eighth transistor is coupled with the second input terminal, and a drain of the eighth transistor is coupled with the source of the second transistor.

8. The latch according to claim 2, wherein the first control sub-unit comprises a seventh transistor which is a PMOS transistor, wherein a drain of the seventh transistor is coupled with the drain of the first transistor, a gate of the seventh transistor is coupled with the second input terminal, a source of the seventh transistor is coupled with the drain of the third transistor, the drain of the fifth transistor, the gate of the fourth transistor and the first output terminal.

9. The latch according to claim 8, wherein the first control sub-unit further comprises an eighth transistor which is a PMOS transistor, wherein a drain of the eighth transistor is coupled with the drain of the second transistor, a gate of the eighth transistor is coupled with the first input terminal, a source of the eighth transistor is coupled with the drain of the fourth transistor, the drain of the sixth transistor, the gate of the third transistor and the second output terminal.

10. The latch according to claim 9, wherein the drain of the seventh transistor and the drain of the eighth transistor are coupled with each other.

11. The latch according to claim 2, wherein the first control sub-unit comprises a seventh transistor which is a PMOS transistor, wherein a drain of the seventh transistor is coupled with the ground wire, a gate of the seventh transistor is coupled with the second input terminal, a source of the seventh transistor is coupled with the source of the first transistor.

12. The latch according to claim 11, wherein the first control sub-unit further comprises an eighth transistor which is a PMOS transistor, wherein a drain of the eighth transistor is coupled with the ground wire, a gate of the eighth transistor is coupled with the first input terminal, a source of the eighth transistor is coupled with the source of the second transistor.

13. The latch according to claim 2, wherein the second control sub-unit comprises a ninth transistor which is an NMOS transistor, wherein a source of the ninth transistor is coupled with the drain of the second transistor, a gate of the ninth transistor is coupled with the second input terminal, a drain of the ninth transistor is coupled with the drain of the fourth transistor, the drain of the sixth transistor, the gate of the third transistor and the second output terminal.

14. The latch according to claim 13, wherein the second control sub-unit further comprises a tenth transistor which is an NMOS transistor, wherein a source of the tenth transistor is coupled with the drain of the first transistor, a gate of the tenth transistor is coupled with the first input terminal, a drain of the tenth transistor is coupled with the drain of the third transistor, the drain of the fifth transistor, the gate of the fourth transistor and the first output terminal.

15. The latch according to claim 14, wherein the source of the ninth transistor and the source of the tenth transistor are coupled with each other.

16. The latch according to claim 2, wherein the second control sub-unit comprises a ninth transistor which is an NMOS transistor, wherein a source of the ninth transistor is coupled with the ground wire, a gate of the ninth transistor is coupled with the second input terminal, a drain of the ninth transistor is coupled with the source of the second transistor.

17. The latch according to claim 16, wherein the second control sub-unit further comprises a tenth transistor which is an NMOS transistor, wherein a source of the tenth transistor is coupled with the ground wire, a gate of the tenth transistor is coupled with the first input terminal, a drain of the tenth transistor is coupled with the source of the first transistor.

18. The latch according to claim 2, wherein the second control sub-unit comprises a ninth transistor which is a PMOS transistor, wherein a drain of the ninth transistor is coupled with the drain of the second transistor, a gate of the ninth transistor is coupled with the first input terminal, a source of the ninth transistor is coupled with the drain of the fourth transistor, the drain of the sixth transistor, the gate of the third transistor and the second output terminal.

19. The latch according to claim 18, wherein the second control sub-unit further comprises a tenth transistor which is a PMOS transistor, wherein a drain of the tenth transistor is coupled with the drain of the first transistor, a gate of the tenth transistor is coupled with the second input terminal, a source of the tenth transistor is coupled with the drain of the third transistor, the drain of the fifth transistor, the gate of the fourth transistor and the first output terminal.

20. The latch according to claim 19, wherein the drain of the ninth transistor and the drain of the tenth transistor are coupled with each other.

21. The latch according to claim 2, wherein the second control sub-unit comprises a ninth transistor which is a PMOS transistor, wherein a drain of the ninth transistor is coupled with the ground wire, a gate of the ninth transistor is coupled with the first input terminal, a source of the ninth transistor is coupled with the source of the second transistor.

22. The latch according to claim 21, wherein the second control sub-unit further comprises a tenth transistor which is a PMOS transistor, wherein a drain of the tenth transistor is coupled with the ground wire, a gate of the tenth transistor is coupled with the second input terminal, a source of the tenth transistor is coupled with the source of the first transistor.

23. A frequency divider, comprising at least two of the latches according to claim 1, wherein the at least two of the latches comprises a first latch and a second latch, and the first input terminal and the second input terminal of the first latch are respectively coupled with the first output terminal and the second output terminal of the second latch.

* * * * *